United States Patent
Zoestbergen et al.

(10) Patent No.: US 11,261,860 B2
(45) Date of Patent: Mar. 1, 2022

(54) METHOD TO CONTROL THE TEMPERATURE OF AN ELECTROMAGNETIC PUMP

(71) Applicant: TATA STEEL NEDERLAND TECHNOLOGY B.V., Velsen-Noord (NL)

(72) Inventors: Edzo Zoestbergen, Alkmaar (NL); Colin Commandeur, Beverwijk (NL); Roland Jan Snijders, Wijkaan Zee (NL); Eduard Paul Mattheus Bakker, Sint Pancras (NL); Peter William Hazelett, Winooski, VT (US); Douglas Alexander Hamilton, Shelburne, VT (US); Stephen James Widdis, Colchester, VT (US); Timothy Dean Kaiser, Colchester, VT (US)

(73) Assignee: TATA STEEL NEDERLAND TECHNOLOGY B.V., Velsen-Noord (NL)

(*) Notice: Subject to any disclaimer, the term of this patent is extended or adjusted under 35 U.S.C. 154(b) by 694 days.

(21) Appl. No.: 16/098,493

(22) PCT Filed: May 1, 2017

(86) PCT No.: PCT/EP2017/060315
§ 371 (c)(1),
(2) Date: Nov. 2, 2018

(87) PCT Pub. No.: WO2017/191081
PCT Pub. Date: Nov. 9, 2017

(65) Prior Publication Data
US 2021/0239110 A1     Aug. 5, 2021

(30) Foreign Application Priority Data
May 3, 2016 (EP) .................................. 16168173

(51) Int. Cl.
*C23C 14/24* (2006.01)
*F04B 17/04* (2006.01)
(Continued)

(52) U.S. Cl.
CPC ............ *F04B 49/06* (2013.01); *C23C 14/246* (2013.01); *F04B 17/04* (2013.01); *H02K 44/04* (2013.01)

(58) Field of Classification Search
CPC ......... F04B 17/04; F04B 49/06; H02K 44/04; C23C 14/246
(Continued)

(56) References Cited

U.S. PATENT DOCUMENTS 2,664,852 A    1/1954 Chadsey
3,059,612 A   10/1962 Baughman et al.
(Continued)

FOREIGN PATENT DOCUMENTS

CN    101582627 A    11/2009
CN    204805055 U    11/2015
(Continued)

OTHER PUBLICATIONS

International Search Report and Written Opinion dated Jun. 9, 2017 for PCT/EP2017/060315 to Tata Steel Nederland B.V. filed May 1, 2017.
(Continued)

*Primary Examiner* — Patrick Hamo
(74) *Attorney, Agent, or Firm* — Vorys, Sater, Seymour and Pease LLP

(57) ABSTRACT

A method to control the temperature of an electromagnetic pump in an apparatus wherein a liquid metal is supplied through a feed tube from a container adapted to contain a liquid metal to an evaporator device in a vacuum chamber, wherein the temperature of the electromagnetic pump is controlled by controlling one or more of (Continued)

the force exerted on the liquid metal in the container, the current of the electromagnetic pump, and/or the strength of the magnet field of the electromagnetic pump.

20 Claims, 4 Drawing Sheets

(51) Int. Cl.
*H02K 44/04* (2006.01)
*F04B 49/06* (2006.01)

(58) Field of Classification Search
USPC ..................................................... 417/48, 50
See application file for complete search history.

(56) References Cited

U.S. PATENT DOCUMENTS

| | | | |
|---|---|---|---|
| 3,408,224 A | 10/1968 | Ashburn et al. | |
| 3,581,766 A | 6/1971 | Gimigliano et al. | |
| 4,392,786 A | 7/1983 | Merenkov et al. | |
| 5,054,750 A * | 10/1991 | Bykhovsky | H02K 44/04 266/237 |
| 5,209,646 A * | 5/1993 | Smither | H02K 44/04 310/11 |
| 8,481,120 B2 * | 7/2013 | Choquet | C23C 14/24 427/251 |
| 2005/0072361 A1 | 4/2005 | Yang et al. | |
| 2011/0195187 A1 * | 8/2011 | Weber | C23C 14/568 427/248.1 |
| 2015/0219122 A1 * | 8/2015 | Vetrovec | F04F 1/06 417/410.1 |
| 2019/0153587 A1 | 5/2019 | Zoestbergen et al. | |
| 2019/0264320 A1 | 8/2019 | Zoestbergen et al. | |

FOREIGN PATENT DOCUMENTS

| | | |
|---|---|---|
| DE | 102006041863 A1 | 3/2008 |
| EP | 2831305 | 2/2015 |
| GB | 1220020 A | 1/1971 |
| JP | S36-1832 B | 3/1961 |
| JP | S59038379 A | 3/1984 |
| JP | H1-181607 A | 7/1989 |
| JP | H01-120784 U | 8/1989 |
| JP | H02-99254 A | 4/1990 |
| JP | H8-509170 T | 10/1996 |
| JP | 2005-205479 A | 8/2005 |
| JP | 2015519469 A | 7/2015 |
| WO | 9423866 A1 | 10/1994 |
| WO | 2012081738 A1 | 6/2012 |
| WO | 2013143692 A1 | 10/2013 |
| WO | 2015067662 A1 | 5/2015 |
| WO | 2017191082 A1 | 11/2017 |
| WO | 2017191083 A1 | 11/2017 |

OTHER PUBLICATIONS

Notice of Reasons for Refusal dated Feb. 2, 2021 in Japanese Patent Application No. 2018-557819.

* cited by examiner

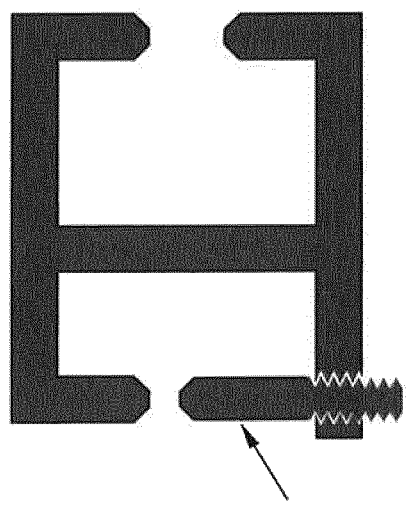 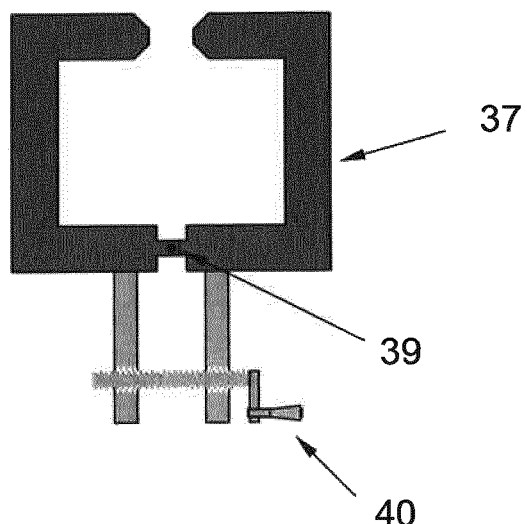
Fig. 3A    38    Fig. 3B

METHOD TO CONTROL THE TEMPERATURE OF AN ELECTROMAGNETIC PUMP

CROSS-REFERENCE TO RELATED APPLICATIONS

This is a § 371 National Stage Application of International Application No. PCT/EP2017/060315 filed on May 1, 2017, claiming the priority of European Patent Application No. 16168173.9 filed on May 3, 2016.

FIELD OF THE INVENTION

The invention relates to a method to control the temperature of an electromagnetic pump for feeding liquid metal to an evaporator device in a vacuum chamber, as well as to an electromagnetic pump. Such a device is for instance used in deposition of a metal coating on a substrate by means of physical vapour deposition (PVD).

BACKGROUND OF THE INVENTION

For continuous or semi-continuous PVD coating processes on an industrial scale a vacuum coating set-up is required that is able to process large amounts of coating material over time. Furthermore, when thermal evaporation is used the temperature of the liquid in the evaporator device has to be much higher than the melting point of the material to be evaporated. Hence, it is desirable and cost effective to have a small evaporator device and to supply material into the evaporator device to meet the demand. Feeding can be done with either solid or liquid material. However, the best way is to feed with liquid metal from a large liquid reservoir which has the advantage that the oxide content in the evaporator is minimised and that the latent heat of melting and the specific heat of the material do not have to be supplied at the evaporator device.

The PVD coating device disclosed in U.S. Pat. No. 2,664,852 has a reservoir for liquid metal in the vacuum chamber. With this set-up the maximum campaign length is quite limited. In more recent PVD coating devices the liquid metal reservoir is places outside the vacuum chamber, see for instance WO2012081738. However, due to the pressure difference between the vacuum at the evaporator device and the liquid metal reservoir a force is executed on the liquid metal in the reservoir which needs to be controlled. This force will change when the liquid level in the reservoir drops, the vacuum pressure at the evaporator device changes or the level in the evaporator device changes and needs to be controlled to keep a constant supply to the evaporator device to ensure a constant evaporation.

The supply of liquid metal from the liquid metal container to the evaporator device can be controlled in different ways. In U.S. Pat. No. 3,059,612 it is disclosed to lift the container with liquid metal in order to keep the height difference between the liquid metal surface in the evaporator device and the level in the liquid metal container constant. However, a change in barometric pressure will already give rise to a different level in the evaporator device and as a result a change in evaporation.

In U.S. Pat. No. 3,581,766 an additional reservoir is provided between the main liquid metal container and the evaporator device. In this intermediate reservoir the level is kept constant by means of an overflow drain through which the liquid flows out of the intermediate reservoir back to the main liquid metal container. However, the issue with a varying barometric pressure still exist and the question how to start or stop the system without breaking the vacuum might prove difficult. Hence, first off-all a valve is required between the liquid metal container and the evaporator device, see for example WO2012081738. It is tried to use such a valve to control the flow but this is impractical and it is not possible to empty the evaporator device at the end of an experiment without breaking the vacuum. A better solution is disclosed in WO2013143692 where both a valve and a pump are used to control the flow.

However, there are still other issues that are not covered in the aforementioned publications. One of the issues with the reservoir being located outside the vacuum chamber is related to the fact that the feed tube has to pass through the wall of the vacuum chamber. The feed through for the feed tube must be able to accommodate the expansion difference that occur during heating of the whole set-up but should be such that the vacuum conditions in the chamber are not affected. This can be done with a bellow type of connection, see for instance GB1220020, but it is just as important that this set-up does not generate a cold spot which might result in freezing of the melt and as such a blockage.

Another requirement is that all the tubing and the electromagnetic pump should be heated to the required temperature and maintained at that temperature during operation. More in particular the heating of the electromagnetic pump requires special attention because due to the construction of the electromagnetic pump cold spots in the pump may easily occur.

Another issue with the reservoir being located on the outside is possible contamination of the feeding system with oxides from the liquid container which might be introduced in the evaporator or the tubing and generate issues with the evaporation or blockage. In patent JPS5938379 a start up procedure is described that uses a reducing gas to remove the oxides. However this will not work for all kinds of liquids and the vacuum is changed during this process.

Jet another requirement is that all the tubing should be heated to the required temperature and furthermore as stated in U.S. Pat. No. 3,408,224 it might be necessary to degas the liquid material prior to the deposition to assure that this degassing is not occurring in the evaporator which might disturb the evaporation process.

Finally the method disclosed in WO2015067662 makes it possible to drain the evaporator without braking the vacuum but it is without additional measures not possible to empty all the tubing in the system.

Objectives of the Invention

It is an objective of the present invention to provide a method to provide sufficient heating of the electromagnetic pump.

It is another objective of the present invention to provide a method to provide for a sufficient heating of the tubes of the system.

It is another objective of the present invention to provide a method wherein heat losses of the electromagnetic pump and the tubes of the system is further limited.

It is still another objective of the present invention to provide an electromagnetic pump with means to easily control the heating of the electromagnetic pump.

DESCRIPTION OF THE INVENTION

According to a first aspect of the invention one or more of the objectives of the invention are realized by providing a method to control the temperature of an electromagnetic pump in an apparatus wherein a liquid metal is supplied through a feed tube from a container adapted to contain a liquid metal to an evaporator device in a vacuum chamber, wherein the supply of the liquid metal is controlled by exerting a force on the liquid metal in the container, the pressure in the evaporator device and by the electromagnetic pump in the feed tube, wherein the method comprises:

providing an electromagnetic pump which is at least partially made of an electric conductive material, supplying current for the electromagnetic pump through the electric conductive material, and controlling the temperature of the electromagnetic pump by controlling one or more of:

the force exerted on the liquid metal in the container, the current of the electromagnetic pump, and/or the strength of the magnet field of the electromagnetic pump.

The temperature of the electromagnetic pump is at least partially determined by the current through the electric conductive material of the electromagnetic pump. The electromagnetic pump controls the flow of the liquid metal by the Lorentz force exerted on the liquid metal which is dependent on the applied magnetic field and the current through the liquid metal. In the method the force is exerted against the flow from the container to the vacuum chamber. The force exerted with the electromagnetic pump on the liquid metal equals F=B*I*C, wherein:
B is the magnetic field, I the current through the electromagnetic pump and through the liquid metal and C a constant. For the heating of the electromagnetic pump the current need to be increased for a certain time, which can be done:

by increasing the force exerted on the liquid metal in the container which requires a larger counter force by the electromagnetic pump in order to keep the flow rate constant, by decreasing the magnetic field and at the same time increasing the current to keep the flow rate constant, by alternating the current through the electromagnetic pump and the liquid metal, wherein the volume of liquid metal within the evaporator device is fluctuated between different levels. By decreasing and increasing the current the net effect of $P=I^2 \times R$ is that the temperature of the electromagnetic pump will increase.

In the last mentioned option only the current is changed, whereas in the other two options two of the relevant parameters are changed. It is of course also possible to change all three parameters or to change the difference in height between the level of liquid metal in the container and that in the evaporator device in combination with other parameters, but these control methods are over complicated and for that reason not preferred.

The force exerted on the liquid metal in the container, the current for the electromagnetic pump and/or the strength of the magnet field of the electromagnetic pump are controlled dependent on the required supply of liquid metal to the evaporator device. These parameters can be changed to control the heating of the electromagnetic pump but overall the supply of the liquid metal to the evaporator device should correspond to the required amount of liquid metal in the evaporation device and supplement the amount of evaporated metal. Because of the relatively large volume of liquid metal contained in the evaporator device there is sufficient play between minimum and maximum level of liquid metal in the evaporation device as a result of which there is enough room to change control parameters that affect the level in the of liquid metal in the evaporator device.

According to a further aspect of the invention it is provided that the container adapted to contain a liquid metal is a closed container. The term "closed container" will mean a container wherein the pressure and/or the composition of the gas inside the container is or van be controlled.

The force exerted on the liquid metal in the container is preferably controlled by controlling the pressure of a gas in the closed container. In this way the force to be exerted on the liquid metal in the container can be controlled very easily and can be varied rapidly if need be.

It is preferably provided that the electromagnetic pump is at least partially made of graphite. Graphite is an electric conductive material and is able to withstand high temperatures as well as the chemical attack of liquid metals, such as Zn and Mg. The electromagnetic pump can be made out of more than one conductive material, which however is not very practical and would raise more problems than it would have advantages.

According to a further aspect of the invention it is provided that the electrodes to supply the current for the electromagnetic pump are provided against the pump. With the electrodes against the outside of the pump body or in a recess in the pump body the current needed for the control of the electromagnetic pump is conducted for a part through the body of the electromagnetic pump and for a part through the liquid metal to be controlled with the electromagnetic pump.

It is further provided that the electromagnetic pump is provided in a vacuum enclosure. With such a vacuum enclosure the heat losses of the electromagnetic pump are reduced because the heat loss as a result of heat convection is reduced to a large extent.

According to a further aspect of the invention it is provided that the vacuum enclosure encloses at least part of the feed tube. The at least part of the feed tube concerns part or complete feed tube as far as it is outside the closed container adapted to contain a liquid metal and the vacuum chamber.

It is preferably provided that the vacuum enclosure connects to the vacuum chamber and/or the closed container. With this set-up the larger or whole part of the feed tube outside the closed container and the vacuum chamber is within the vacuum enclosure.

According to a further aspect of the invention it is provided that the vacuum enclosure is connected to the vacuum chamber and/or the closed container by means of a flexible connecting member. With this feature the expansion of each or all of closed container, vacuum enclosure and vacuum chamber caused by temperature changes will be accommodated.

With the electromagnetic pump and the feed tube in the vacuum enclosure the heat loss through convection is limited where it counts the most, in between the closed container and the vacuum chamber. In this manner cold spots in the electromagnetic pump and feed tube are prevented therewith preventing restriction of the flow of liquid metal and clogging.

The pressure in the vacuum enclosure is kept in the range of 1 mbar to atmospheric pressure, which is roughly 1000 mbar. With the start and at the end of an operation cycle or campaign of the apparatus, that is with the filling and draining of the feed tube and the electromagnetic pump respectively the pressure in the vacuum enclosure is about atmospheric pressure. During operation the pressure in the vacuum enclosure is preferably kept in the range of 1-200 mbar. By keeping the pressure in the vacuum enclosure in the low vacuum range the pressure loss in the vacuum chamber is much less than without the vacuum enclosure. Such a pressure loss in the vacuum chamber occurs at the feed through of the feed tube into the vacuum chamber and is influenced by the expansion differences of the different components of the whole set-up.

It is further provided that the feed tube is heated. The feed tube is heated by means of resistance heating or by means of heaters provided in the wall of the feed tube. Although heat losses of the feed tube are partially prevented by enclosing at least part of the feed tube in the vacuum enclosure it will still be needed to heat the feed tube because of the distance between the closed container and the electromagnetic pump and between the electromagnetic pump and the evaporator device.

According to a further aspect of the invention a return tube and an electromagnetic pump in the return tube are provided, wherein the return tube runs from the evaporator device to the closed container, wherein the electromagnetic pump in the return tube is at least partially made of an electric conductive material and wherein the current for the electromagnetic pump is supplied through the electric conductive material and wherein the temperature of the electromagnetic pump in the return tube is controlled by controlling the current of the electromagnetic pump and/or the strength of the magnet field of the electromagnetic pump.

With a feed tube and a return tube the composition of the liquid metal in the evaporator device can be controlled. Control of the composition means that the composition remains constant as much as possible and is not changed because of different evaporation rates of constituents.

In a first embodiment the electromagnetic pump in the return tube is positioned parallel to the electromagnetic pump in the feed tube. With that configuration the electromagnetic pumps are placed against each other which allows to provide a common magnet for the electromagnetic pump in the return tube and the electromagnetic pump in the feed tube. In order to be able to control the flow rate in each tube separate power supplies are provided for the feed tube and the return tube.

In a second embodiment the electromagnetic pump in the return tube is positioned in series with the electromagnetic pump in the feed tube and the facing electrodes of the electromagnetic pumps are connected. By placing the electromagnetic pumps against each other the facing electrodes are connected.

With this configuration the electromagnetic pump in the return tube and the electromagnetic pump in the feed tube each have their own magnet and only one power supply is required for both tubes.

If the strength of the magnetic field is controlled in order to control the flow rate of the liquid metal two options are provided. A first option is that the magnet field of the electromagnetic pump is controlled by controlling the distance of the magnet poles with respect to the electromagnetic pump. A second option is controlling the magnetic flux by providing a second yoke arm at which the distance between two poles can be varied. A third option is controlling the magnetic field provided by an electromagnet by controlling a direct or alternating current through the coil of the electromagnet.

For a permanent magnet only the first and second option are available and for an electromagnet all three options are available but in the latter case the third option will be the option of choice.

The invention also provides in an electromagnetic pump for use with a liquid metal, wherein the electromagnetic pump is at least partially made of an electric conductive material and wherein electrodes of the electromagnetic pump are provided against the electromagnetic pump. Preferably the electromagnetic pump is at least partially made of graphite.

Further, control means are provided to control the current for the electromagnetic pump and/or to control the magnetic field for the electromagnetic pump.

According to a further aspect of the invention the control means for the electromagnetic pump control the distance of the magnet poles with respect to the electromagnetic pump and/or where the magnetic field is provided by means of a direct or alternating current electromagnet, control the current through the coil of the electromagnet.

BRIEF DESCRIPTION OF THE DRAWINGS

The invention will be further explained by the example shown in the drawing, in which:

FIG. 3A,3B shows schematically two configurations to control the distance of the magnetic poles to the electromagnetic pump.

DETAILED DESCRIPTION OF THE DRAWINGS

Figure 1:
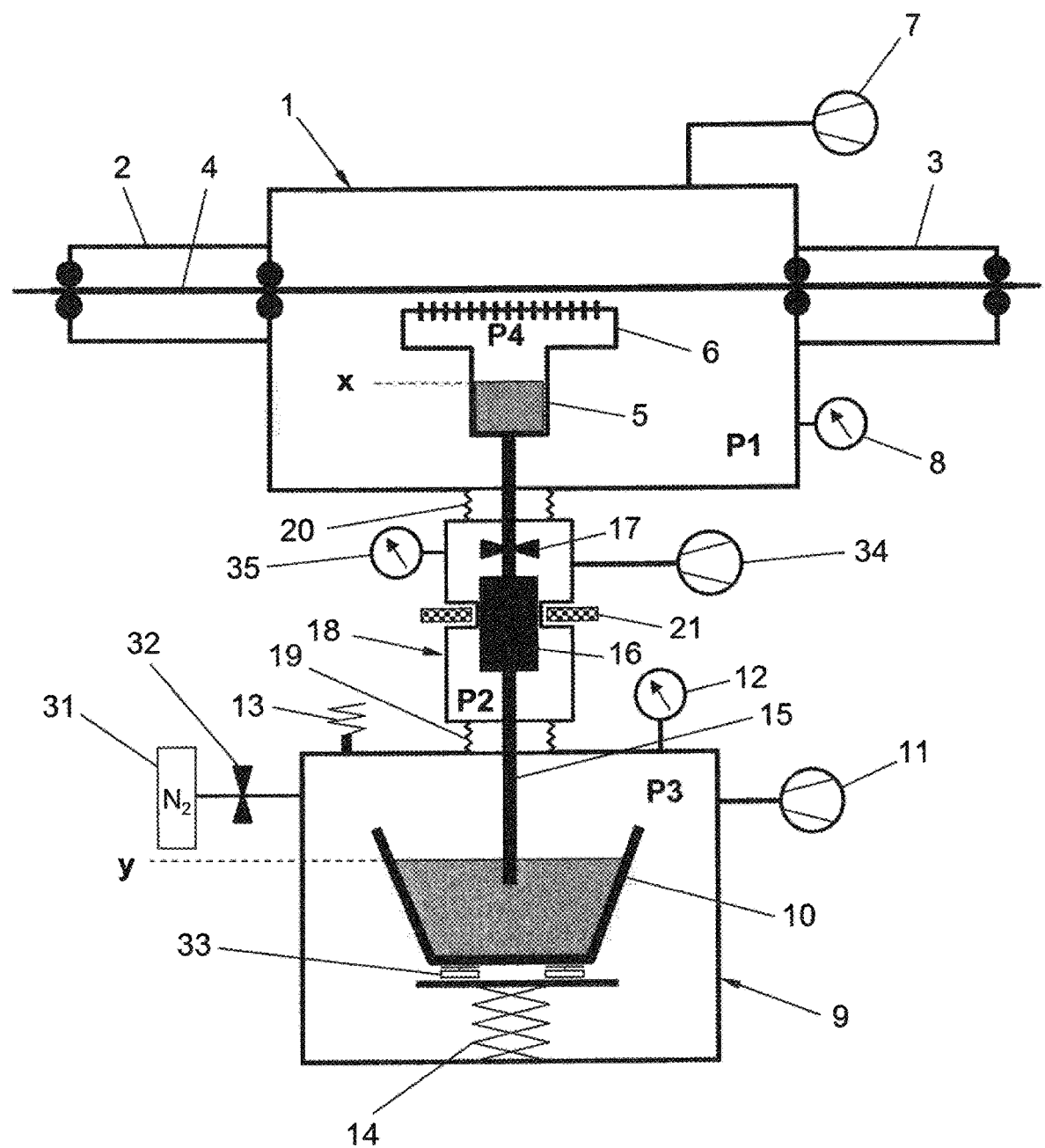
FIG. 1 shows a schematic view of an apparatus with a container for a liquid metal, an electromagnetic pump in a vacuum enclosure and a vacuum chamber.

FIG. 1 shows a schematic view of an apparatus with a vacuum chamber 1, on both sides provided with vacuum locks 2,3, through which a strip 4 is guided. An evaporator device 5 is positioned inside the vacuum chamber 1 and connected to a vapour distributor 6. The means to supply sufficient energy to the evaporator device, such as in induction coil, are also placed inside the vacuum chamber. For the sake of clarity these means are not shown in the drawing. The vacuum chamber is further provided with vacuum pump 7 and manometer 8.

At the bottom of FIG. 1 a closed container 9 is provided with inside the container a vessel 10 to hold a liquid metal. The closed container 9 is further provided with a pump 11, manometer 12 and overpressure relay 13. The vessel is provided with heating means (not shown) to heat and melt the metal and/or to keep the liquid metal at a certain temperature. A gas supply 31 with a valve 32 is connected to closed container 9 to replace the air initially present in container 9 with a non-oxidising gas, for instance N2. Lifting means 14 are provided to lift and lower vessel 10 to be able to immerse the end of feed tube 15 into the liquid metal or lift it out of the liquid metal. The lifting means 14 can also be used in the control of the flow rate of the liquid metal to the evaporator device 5, since with the lifting and lowering the distance between the liquid level in the vessel and that in the evaporation device changes.

The vessel 10 is placed on weighing devices 33 which allows to continuously weigh the content of vessel 10 which provides additional information on the flow rate of the liquid metal and the evaporation rate.

The pump 11 is used to lower the pressure in the closed container. In order to prevent oxidation of the liquid metal in the vessel the air in the closed container can be removed and replaced completely or partially with an inert gas. With this operation the air is first partially removed therewith lowering the pressure before being replaced by an inert gas after which the pressure in the closed container is adjusted and controlled in order to control the flow rate of the liquid metal to the evaporator device.

The feed tube 15 runs from the vessel 10 inside the closed container 9 in upward direction to the evaporator device 5 and in the feed tube an electromagnetic pump 16 and a valve 17 are provided. The electromagnetic pump 16 and valve 17 are placed inside a vacuum enclosure 18. The vacuum enclosure 18 is kept at a low vacuum during operation which prevent heat losses through convection from the electromagnetic pump 16 as well as from the feed tube 15 to a great degree. To that end the vacuum enclosure 18 is provided with a vacuum pump 34 and a manometer 35.

The vacuum enclosure 18 connects to the closed container 9 and the vacuum chamber 1 by means of bellows 19, 20. The connection by means of the bellows 19, 20 is to the outside of the closed container 9 and the vacuum chamber 1 and does not connect the internal spaces of container 9 and vacuum chamber 1. However, the unavoidable vacuum leak at the feed through of the feed tube 15 into the vacuum chamber 1 is much less because of the low vacuum in the vacuum enclosure 18.

The electromagnetic pump 16 pump is provided with a permanent magnet 21 to generate a magnetic field and a power supply to pass a current through the liquid metal in the electromagnetic pump. The Lorentz force resulting from the magnetic field and the current will exert a force on the liquid metal which is used in the control of the flow rate of the liquid metal. The Lorentz force only works as long as the liquid metal is in contact with the electrodes 22 of the electromagnetic pump and within the magnetic field of permanent magnet 21. As a result when the liquid metal is forced downwards the liquid metal level can not be lower than a level at about the height of the electrodes.

It is important that the magnet 21 is not overheated because this will result in a decrease of the strength of the magnetic field. For that reason the magnet 21 is placed outside the vacuum enclosure 18, which at least at the location of the magnet and its magnetic field is made of a non-ferromagnetic material.

The upward force on the liquid metal is given by the pressure difference and the column height:

$$P3-P1-(X-Y)*\text{density liquid, wherein}$$

P3=the pressure in the closed container,
P1=the pressure in the vacuum chamber,
X=height top level of the liquid metal, which can be in the evaporator device or somewhere in the feed tube, and
Y=height level of the liquid metal in the vessel in the closed container.

Once the evaporation of the liquid metal in the evaporator device has started the driving force for the liquid metal is:

$$P3-P4-(X-Y)*\text{density liquid, wherein}$$

P4 is the pressure in the vapour distributor 6 which will be higher than the pressure in the vacuum chamber.

When the electromagnetic pump is exerting a force against the upward flow of the liquid metal the force is given by:

$$P3-P1-(X-Y)*\text{density liquid}-B*I*C, \text{wherein:}$$

B is magnetic field, I the current through the liquid metal and C a constant. Once the evaporation has started the equation changes to:

$$P3-P4-(X-Y)*\text{density liquid}-B*I*C$$

If the heating of the electromagnetic pump has to be increased, P3 is increased which will require a larger Lorentz force against the upward flow in order to keep the upward flow constant. The larger Lorentz force is realized to increase the current through the electromagnetic pump and the liquid metal, which will provide the extra resistance heating.

Figure 2A:
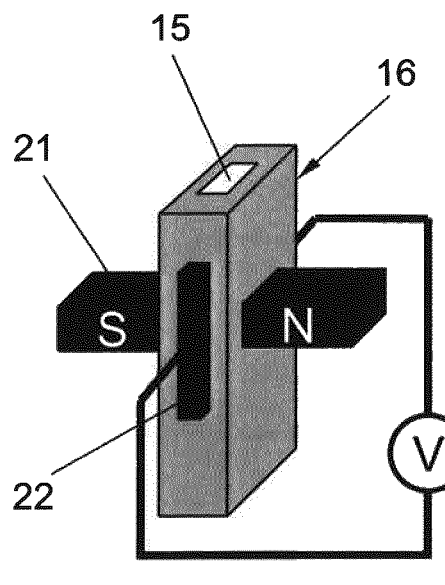
FIG. 2A,2B,2C shows a schematic view of respectively an electromagnetic pump for a feed tube and an electromagnetic pump for a feed tube and return tube.

FIG. 2A shows a schematic view of an electromagnetic pump 16 for a feed tube 15 with the electrodes 22 on opposite sides against the body of the electromagnetic pump 16. The electrodes 22 are connected to a power supply 23, in this case a variable DC power supply.

Perpendicular to the electrodes 22 are the poles of magnet 21, which in this configuration are two permanent magnets connected by means of a yoke (not shown). Instead of permanent magnets it is also possible to use an electromagnet, for instance an electromagnet with a DC coil. By varying the current through the coil the magnetic field could be varied.

Instead of a variable DC power supply and a DC coil it is as well possible to use a variable AC power supply and an AC coil for the electromagnet.

Figure 2B:
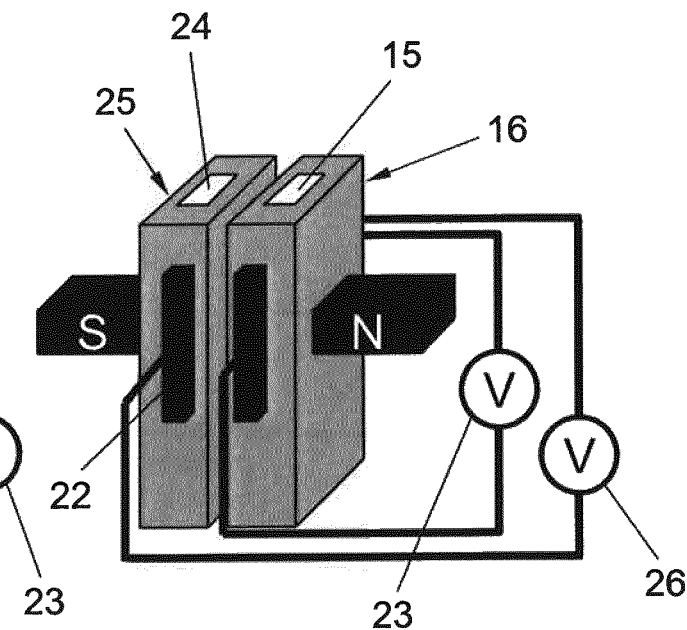

FIG. 2B shows a configuration with a feed tube 15 and a return tube 24 next to each other with electromagnetic pumps 16,25 for respectively the feed tube 15 and return tube 24. The magnetic field for both the feed tube 15 and the return tube 24 is provided with the same permanent magnets 21. Separate variable DC power supplies 23, 26 are provided for respectively the feed tube 15 and the return tube 24 which are reversely connected to the electrodes since the Lorentz forces should be in opposite direction. The feed tube 15 and the return tube 24 are in thermal contact with each other but electrically isolated from each other. The flow rate in the return tube will differ by the evaporation rate from the flow rate in the feed tube and for that reason the current through the return tube 24 will be larger than through the feed tube 15.

Figure 2C:
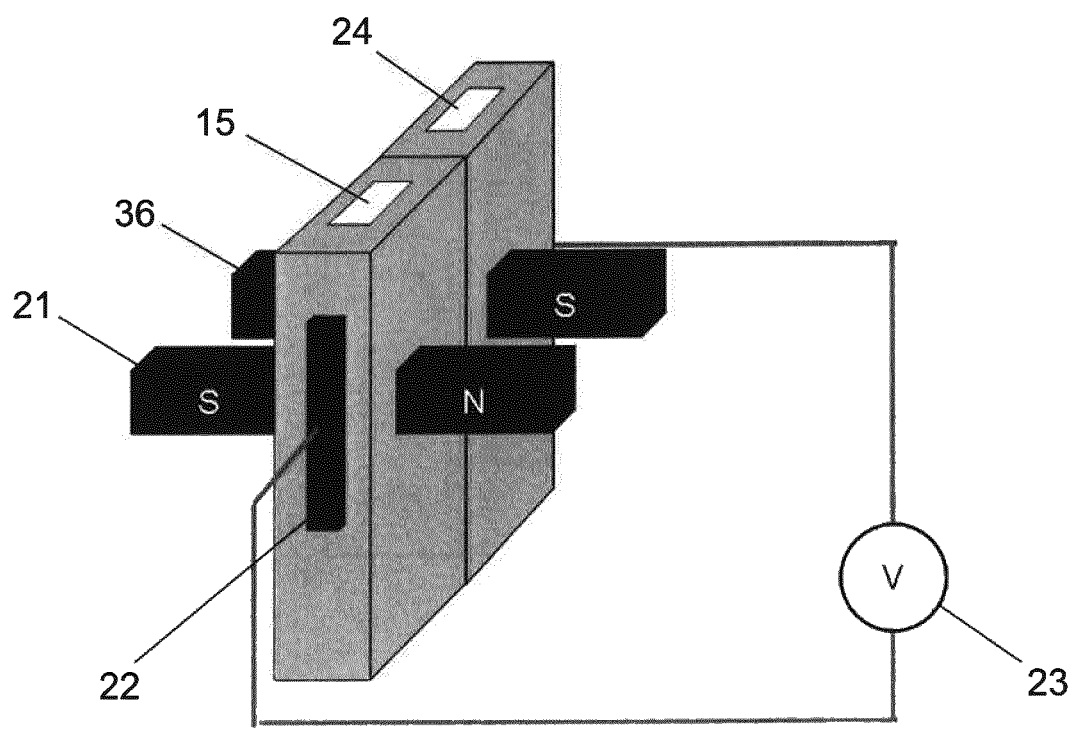

FIG. 2C shows a configuration wherein the electrodes 22 of feed tube 15 and feed tube 24 are connected in series which only requires one power supply 23 and wherein the same current passes through both feed tubes. In order to control the flow rate in each tube the magnetic field of the magnet 21, 36 in each tube 15, 24 is controlled separately.

FIG. 3A,3B shows schematically two configurations to control the strength of the magnetic field of permant magnets by shorting the flux or by changing the distance of the magnetic poles to the electromagnetic pump. In the configuration according to FIG. 3A the flux between the poles of magnet 21 can be changed by shortening the magnetic flux via a second leg 38. The flux is variable by changing the distance between the poles of this second leg. To this end leg 38 of the yoke is designed to allow such linear displacement.

In the configuration according to FIG. 3B the magnetic strength is varied by varying the distance between the poles of magnet 21. This can be varied by a rotation or linear displacement. A rotational displacement is depicted in FIG. 3B where yoke 37 is provided with a pivoting point 39 and a spindle device 40 for a controlled rotation and therewith a controlled change of the distance between the poles of the magnet 21.

Figure 4:
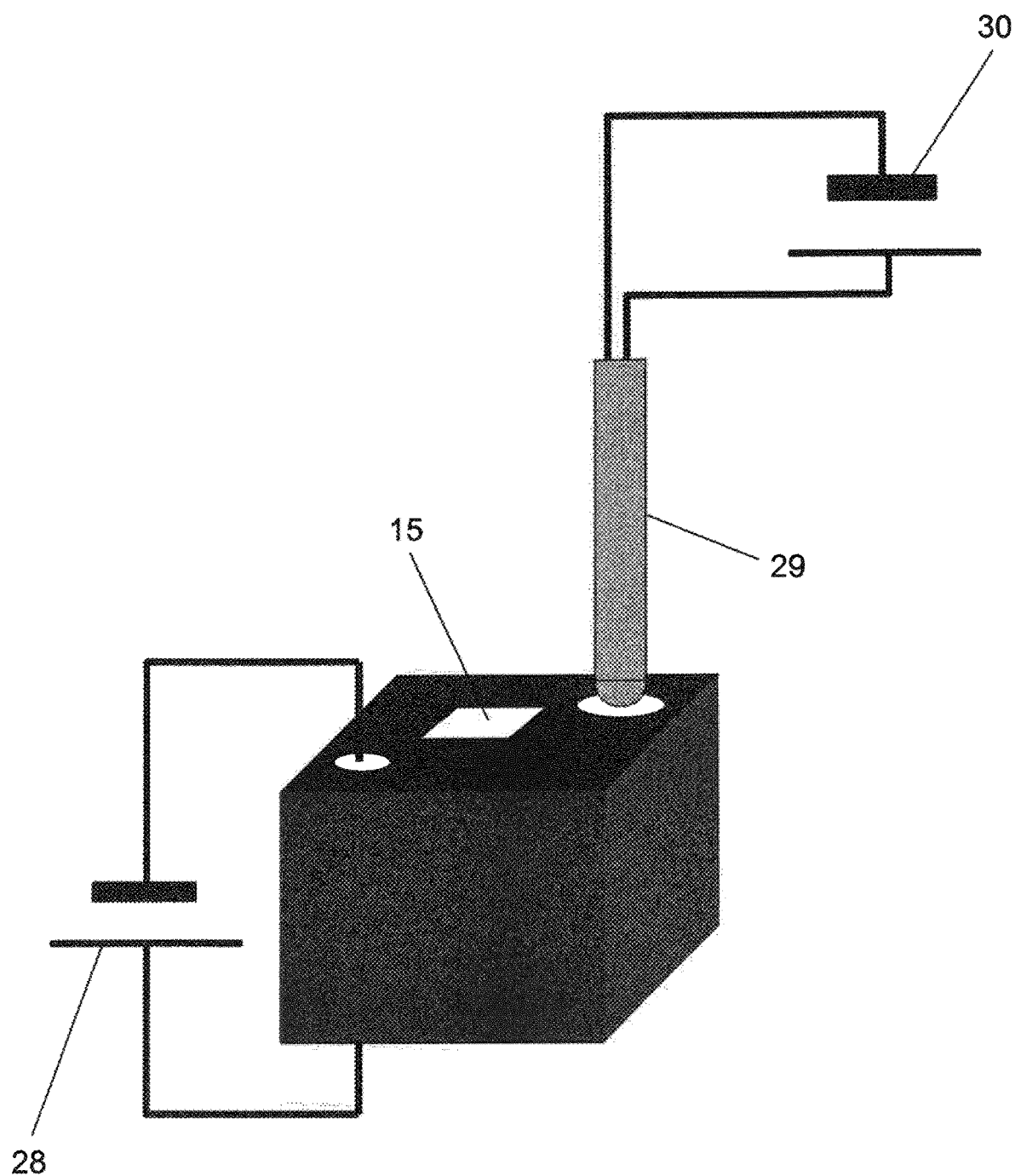
FIG. 4 shows schematically a detail of the feed tube with heating means.

FIG. 4 shows schematically a segment of a feed tube 15 with a channel 27 and two different heating embodiments. A first heating method is heating the feed tube by resistance heating with a power source 28 wherein the material of the feed tube serves as the resistance. The second heating method is with a sheath heater 29 with a power source 30, wherein the heater is provided in a hole or a recess in the feed tube 15. The power sources 28, 30 could be DC or AC power sources. This is in fact also resistance heating wherein the resistance is enclosed in a sheath and electrically isolated from the feed tube. All the tubing must be heated to a temperature above the melting point of the liquid metal for which a temperature of 40° C. above the melting temperature will in general be sufficient.

The invention claimed is:

1. A method to control the temperature of an electromagnetic pump in an apparatus wherein a liquid metal is supplied through a feed tube from a container adapted to contain a liquid metal to an evaporator device in a vacuum chamber, wherein the supply of the liquid metal is controlled by exerting a force on the liquid metal in the container, the pressure in the evaporator device and by the electromagnetic pump in the feed tube, wherein the method comprises:
  providing an electromagnetic pump which is at least partially made of an electric conductive material,
  supplying current for the electromagnetic pump through the electric conductive material, and
controlling the temperature of the electromagnetic pump by controlling one or more of
  the force exerted on the liquid metal in the container,
  the current of the electromagnetic pump, and/or
  the strength of the magnet field of the electromagnetic pump.

2. The method according to claim 1, wherein the force exerted on the liquid metal in the container, the current for the electromagnetic pump and/or the strength of the magnet field of the electromagnetic pump are controlled dependent on the required supply of liquid metal to the evaporator device.

3. The method according to claim 1, wherein the container adapted to contain the liquid metal is a closed container and wherein the force exerted on the liquid metal in the container is controlled by controlling the pressure of a gas in the closed container.

4. The method according to claim 1, wherein the electromagnetic pump is at least partially made of graphite.

5. The method according to claim 1, wherein electrodes to supply the current for the electromagnetic pump are provided against the pump.

6. The method according to claim 1, wherein the electromagnetic pump is provided in a vacuum enclosure.

7. The method according to claim 6, wherein the vacuum enclosure further encloses at least part of the feed tube.

8. The method according to claim 1, wherein the feed tube is heated.

9. The method according to claim 7, wherein the feed tube is heated by means of resistance heating or by means of heaters provided in the wall of the feed tube.

10. The method according to claim 1, wherein a return tube and an electromagnetic pump in the return tube are provided, wherein the return tube runs from the evaporator device to the closed container, wherein the electromagnetic pump in the return tube is at least partially made of an electric conductive material and wherein the current for the electromagnetic pump is supplied through the electric conductive material and wherein the temperature of the electromagnetic pump in the return tube is controlled by controlling the current of the electromagnetic pump and/or the strength of the magnet field of the electromagnetic pump.

11. The method according to claim 10, wherein the electromagnetic pump in the return tube is positioned parallel to the electromagnetic pump in the feed tube.

12. The method according to claim 11, wherein the electromagnetic pump in the return tube and the electromagnetic pump in the feed tube have a common magnet.

13. The method according to claim 10, wherein the electromagnetic pump in the return tube is positioned in series with the electromagnetic pump in the feed tube and wherein facing electrodes of the electromagnetic pumps are connected.

14. The method according to claim 13, wherein the electromagnetic pump in the return tube and the electromagnetic pump in the feed tube each have their own magnet.

15. The method according to claim 1, wherein the magnet field of the electromagnetic pump is controlled by controlling the distance of the magnet poles with respect of the electromagnetic pump and/or controlling the magnetic field provided by an electromagnet by controlling a direct or alternating current through the coil of the electromagnet.

16. The method according to claim 2, wherein the force exerted on the liquid metal in the container is controlled dependent on the required supply of liquid metal to the evaporator device.

17. The method according to claim 2, wherein the current for the electromagnetic pump is controlled dependent on the required supply of liquid metal to the evaporator device.

18. The method according to claim 2, wherein the strength of the magnet field of the electromagnetic pump is controlled dependent on the current for the electromagnetic pump.

19. The method according to claim 18, wherein the magnet field of the electromagnetic pump is controlled by controlling the distance of the magnet poles with respect of the electromagnetic pump.

20. The method according to claim 18, wherein the magnet field of the electromagnetic pump is controlled by controlling the magnetic field provided by an electromagnet by controlling a direct or alternating current through the coil of the electromagnet.

* * * * *